(12) United States Patent
Tokranov et al.

(10) Patent No.: US 11,205,648 B2
(45) Date of Patent: Dec. 21, 2021

(54) IC STRUCTURE WITH SINGLE ACTIVE REGION HAVING DIFFERENT DOPING PROFILE THAN SET OF ACTIVE REGIONS

(71) Applicant: GLOBALFOUNDRIES U.S. Inc., Santa Clara, CA (US)

(72) Inventors: Anton V. Tokranov, Cohoes, NY (US); James P. Mazza, Saratoga Springs, NY (US); Elizabeth A. Strehlow, Malta, NY (US); Harold Mendoza, Ballston Lake, NY (US); Jay A. Mody, Ballston Spa, NY (US); Clynn J. Mathew, Clifton Park, NY (US); Hong Yu, Rexford, NY (US); Yea-Sen Lin, East Fishkill, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/866,663

(22) Filed: May 5, 2020

(65) Prior Publication Data

US 2021/0351283 A1    Nov. 11, 2021

(51) Int. Cl.
| | |
|---|---|
| *H01L 27/088* | (2006.01) |
| *H01L 29/36* | (2006.01) |
| *H01L 29/78* | (2006.01) |
| *H01L 27/06* | (2006.01) |

(Continued)

(52) U.S. Cl.
CPC ...... *H01L 27/0886* (2013.01); *H01L 27/0611* (2013.01); *H01L 29/36* (2013.01); *H01L 29/7851* (2013.01); *H01L 21/823431* (2013.01); *H01L 29/66803* (2013.01)

(58) Field of Classification Search
CPC ......... H01L 21/823431; H01L 27/0886; H01L 27/1211; H01L 29/785–7851; H01L 29/66795–66803; H01L 29/0649; H01L 29/36–365

See application file for complete search history.

(56) References Cited

U.S. PATENT DOCUMENTS

| | | | |
|---|---|---|---|
| 8,881,066 B2 | 11/2014 | Shieh et al. | |
| 9,385,023 B1* | 7/2016 | Cheng | H01L 29/7855 |
| 9,514,995 B1 | 12/2016 | Fogel et al. | |

(Continued)

OTHER PUBLICATIONS

A. H. Gencer, D. Tsamados and V. Moroz, "Fin bending due to stress and its simulation," 2013 International Conference on Simulation of Semiconductor Processes and Devices (SISPAD), Glasgow, 2013, pp. 109-112.

(Continued)

*Primary Examiner* — Errol V Fernandes
*Assistant Examiner* — Jeremy J Joy
(74) *Attorney, Agent, or Firm* — Hoffman Warnick LLC

(57) ABSTRACT

An integrated circuit (IC) structure with a single active region having a doping profile different than that of a set of active regions, is disclosed. The IC structure provides a single active region, e.g., a fin, on a substrate with a first doping profile, and a set of active regions, e.g., fins, electrically isolated from the single active region on the substrate. The set of active regions have a second doping profile that is different than the first doping profile of the single active region. For example, the second doping profile can have a deeper penetration into the substrate than the first doping profile.

17 Claims, 7 Drawing Sheets

(51) Int. Cl.
*H01L 29/66* (2006.01)
*H01L 21/8234* (2006.01)

(56) References Cited

U.S. PATENT DOCUMENTS

| | | | |
|---|---|---|---|
| 9,875,939 B1* | 1/2018 | Ke | H01L 29/165 |
| 10,074,571 B1* | 9/2018 | Greene | H01L 21/823481 |
| 2012/0001268 A1 | 1/2012 | Adkisson et al. | |
| 2015/0333075 A1* | 11/2015 | Yang | H01L 29/06 257/369 |
| 2016/0071932 A1* | 3/2016 | Sung | H01L 21/76224 257/369 |
| 2016/0225771 A1* | 8/2016 | Wu | H01L 21/2254 |
| 2018/0090391 A1* | 3/2018 | Park | H01L 21/823892 |
| 2020/0161315 A1* | 5/2020 | Shen | H01L 29/66636 |
| 2020/0365589 A1* | 11/2020 | Liaw | H01L 21/823821 |

OTHER PUBLICATIONS

S. Tian et al., "A detailed physical model for ion implant induced damage in silicon," in IEEE Transactions on Electron Devices, vol. 45, No. 6, pp. 1226-1238, Jun. 1998.

Wood et al. "Fin Doping by Hot Implant for 14nm FinFET Technology and Beyond." ECS Transactions. 58. 249-256. 10.1149/05809.0249ecst (2013).

T. Y. Wen et al., "Fin Bending Mitigation and Local Layout Effect Alleviation in Advanced FinFET Technology through Material Engineering and Metrology Optimization," 2019 Symposium on VLSI Technology, Kyoto, Japan, 2019, pp. T110-T111.

* cited by examiner

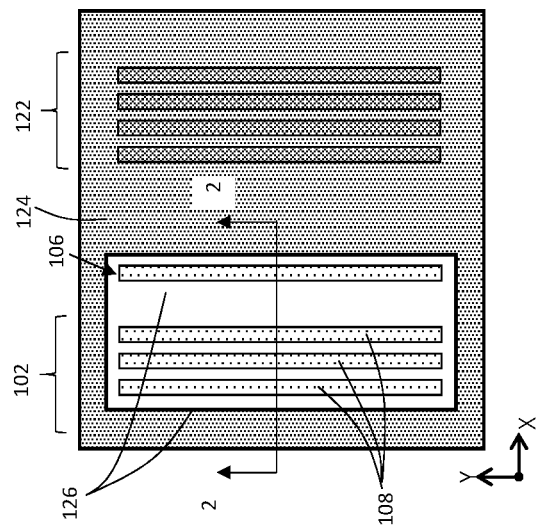
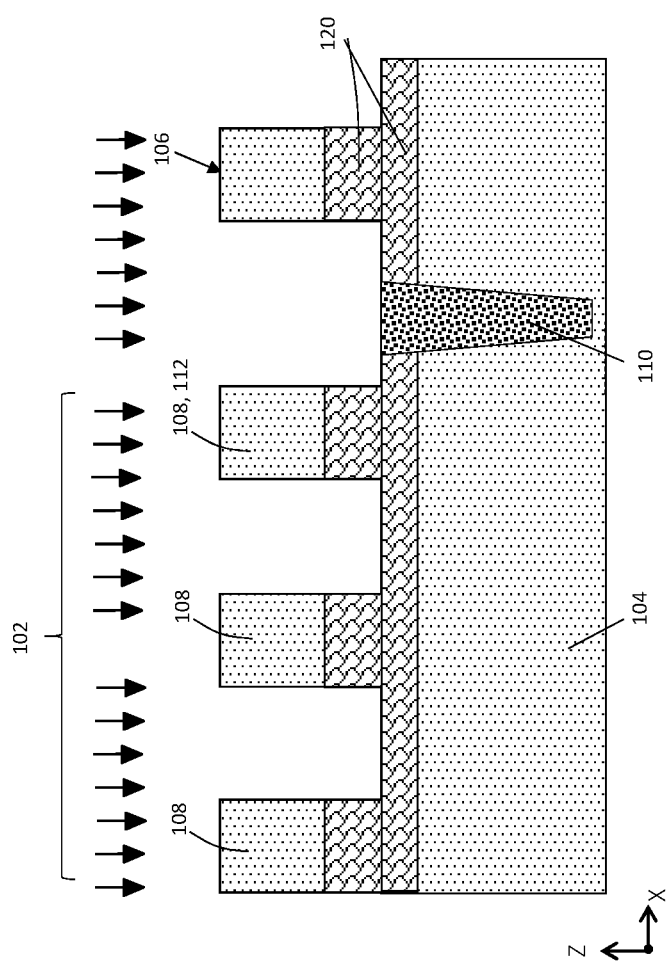

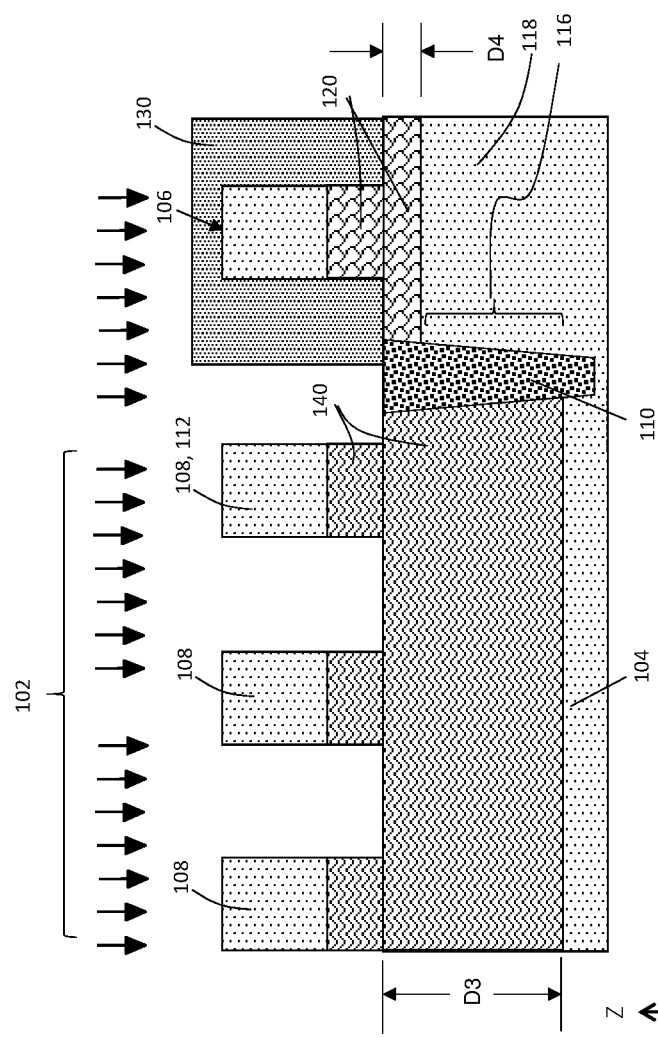
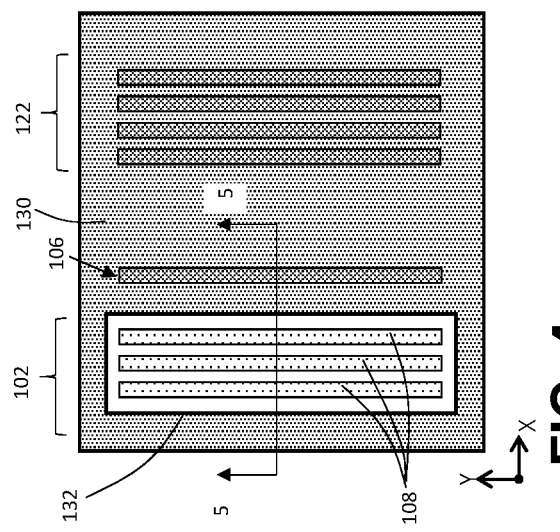
FIG. 5
FIG. 4

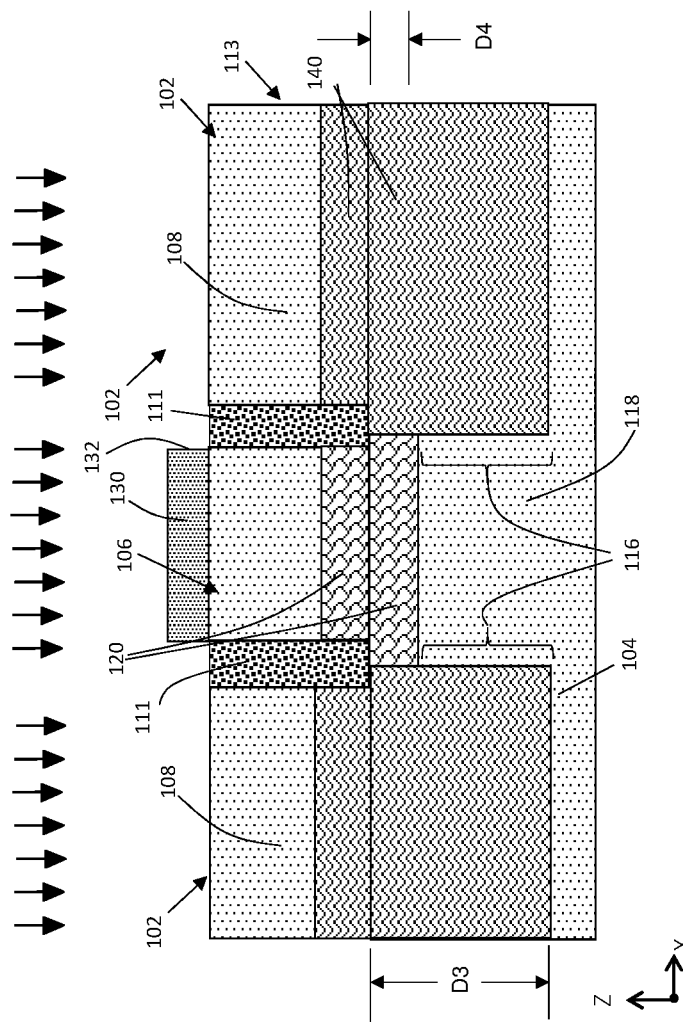
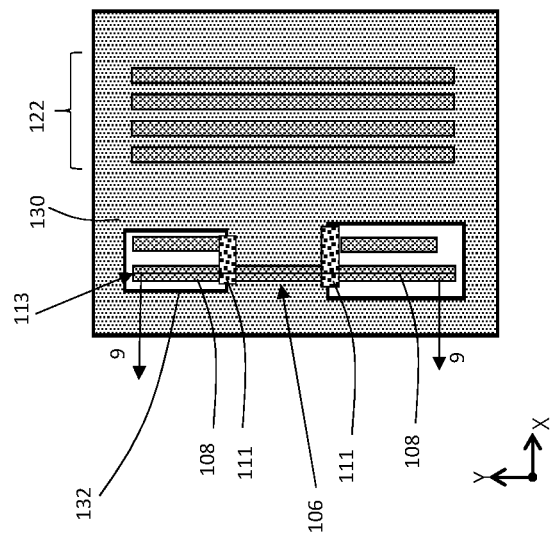
FIG. 9
FIG. 8

IC STRUCTURE WITH SINGLE ACTIVE REGION HAVING DIFFERENT DOPING PROFILE THAN SET OF ACTIVE REGIONS

BACKGROUND

The present disclosure relates to semiconductor fabrication, and more specifically, to an integrated circuit (IC) structure with a single active region and a set of active regions with different doping profiles, and a related method.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") are formed by creating a number of semiconductor fins on a substrate and placing a gate conductor perpendicularly across the fins. A FinFET is created by the gate forming a channel region below the gate in the fin, and source/drain regions formed in the fin aside the gate. Forming a finFET with a single semiconductor fin is advantageous for low power devices at advanced technology nodes, e.g., 12 nanometers and beyond. Forming the single semiconductor fin device can be challenging. Notably, the single semiconductor fin lacks support that would normally be present in a multi-fin arrangement. For pFET devices, the n-well implants of the single fin and substrate can cause weakening defects in the single semiconductor fin. The defects can result in stress-related, structural failures in the single semiconductor fin that can impact performance, such as increased current leakage.

SUMMARY

Aspects of the disclosure is directed to an integrated circuit (IC) structure, comprising: a single active region on a substrate, the single active region having a first doping profile; and a set of active regions electrically isolated from the single active region on the substrate, wherein the set of active regions have a second doping profile that is different than the first doping profile of the single active region.

Another aspect of the disclosure includes an integrated circuit (IC) structure, comprising: a single semiconductor fin on a substrate, the single semiconductor fin having a first n-type doping profile; and a set of semiconductor fins electrically isolated from the single semiconductor fin on the substrate, the set of semiconductor fins having a second n-type doping profile, wherein the second n-type doping profile of the set of semiconductor fins has a greater depth in the substrate than the first n-type doping profile of the single semiconductor fin.

A further aspect of the disclosure related to a method of forming an integrated circuit (IC) structure, the method comprising: forming a set of active regions on a substrate, and a single active region electrically isolated from the set of active regions on the substrate; first doping the set of active regions and the single active region, creating a first doping profile in the set of active regions and the single active region; masking the single active region, leaving the set of active regions exposed; and second doping the set of active regions, creating a second doping profile in the set of active regions that is different than the first doping profile of the single active region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 2 shows a cross-sectional view of a first doping, according to embodiments of the disclosure.

FIG. 3 shows a plan view of a mask for the first doping, according to embodiments of the disclosure.

FIG. 4 shows a plan view of a mask for a second doping, according to embodiments of the disclosure.

FIG. 5 shows a cross-sectional view of the second doping, according to embodiments of the disclosure.

FIG. 8 shows a plan view of a mask for a second doping, according to other embodiments of the disclosure.

FIG. 9 shows a cross-sectional view of the second doping, according to other embodiments of the disclosure.

Figure 1:
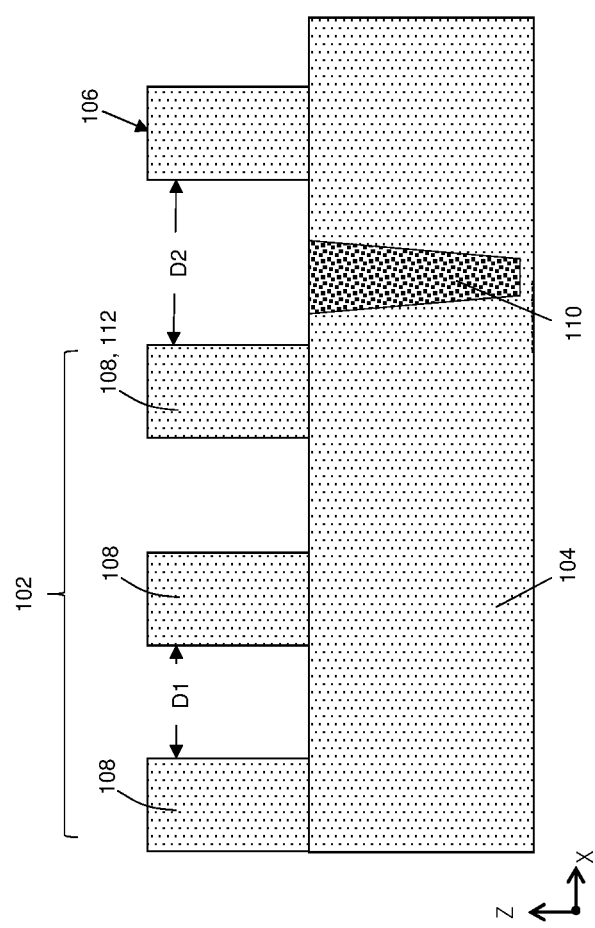
FIG. 1 shows a cross-sectional view of forming active regions, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present disclosure may be practiced. These embodiments are described in sufficient detail to enable those skilled in the art to practice the present teachings, and it is to be understood that other embodiments may be used and that changes may be made without departing from the scope of the disclosure. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide an integrated circuit (IC) structure. The IC structure provides a single active region on a substrate with a first doping profile, and a set of active regions electrically isolated from the single active region on the substrate. The set of active regions have a second doping profile that is different than the first doping profile of the single active region. For example, the second doping profile can have a greater depth into the substrate, i.e., greater penetration into substrate. Similarly, a region of the second doping profile that extends deeper than the first doping profile of the single active region has a higher dopant concentration than a region of the substrate below the first doping profile, the latter of which may be devoid of dopants.

While applicable to a variety of types of active regions such as bulk semiconductor or nanosheets/wires, the teachings of the disclosure are especially advantageous relative to semiconductor fins. Hence, the teachings of the disclosure will be described relative to semiconductor fins only. The teachings of the disclosure allow for a single semiconductor finFET for low power devices at advanced technology nodes, e.g., 12 nanometers and beyond. The teachings may be applicable to any finFET, but are especially advantageous for p-type finFETs (p-finFET), i.e., with n-well implants. In this setting, the extent and/or number of n-well implants of the single semiconductor fin and substrate are reduced compared to other sets of semiconductor fins, thus reducing or eliminating the cause of weakening defects in the single semiconductor fin. The resulting p-finFET does not suffer from defects that can result in stress-related, structural failures in the single semiconductor fin, nor the related performance degradation, such as increased current leakage.

Referring to the drawings, a method of forming an IC structure 100 (FIG. 6) according to embodiments of the disclosure will be described. FIG. 1 shows a cross-sectional view of forming a set of active regions 102 on a substrate 104, and forming a single active region 106 electrically isolated from set of active regions 102 on substrate 104. While three active regions 108 are illustrated as an example for set of active regions 102, any number of active regions may be formed in the set. As noted, active regions 106, 108 are illustrated as semiconductor fins, but could be any form of active region for an integrated circuit (IC) structure. It is understood that "active regions" for a finFET that receive a well implant includes part of the semiconductor fin and part of the substrate thereunder. As will be described, the arrangement of active regions may vary. In this non-limiting example, active regions 106, 108 are formed by a plurality of semiconductor fins electrically isolated by a trench isolation 110. As will also be described, active regions 106, 108 can also be created by a single, selected semiconductor fin, and electrically isolated by one or more diffusion breaks 111 (FIGS. 8-9).

Substrate 104 and active regions 106, 108 may include any semiconductor material such as but not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 104 may be strained. While not illustrated, substrate 104 can be provided as a semiconductor-on-insulator substrate. Active regions 106, 108 may be formed using any now known or later developed semiconductor fabrication techniques. In one non-limiting example, a mask (not shown) may be created over semiconductor substrate 104 and openings between active regions 106, 108 may be etched to form semiconductor fins. Here, set of active regions 102 includes a plurality of semiconductor fins 108, i.e., a set of semiconductor fins, and single active region 106 includes a single semiconductor fin.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. Here, a RIE could be used to form semiconductor fins.

Single active region 106 can be electrically isolated from set of active regions 102 in any now known or later developed fashion. In one non-limiting example, a trench isolation 110 may be formed in substrate 104 to electrically isolate the parts. Trench isolation 110 may include any form of trench isolation, e.g., a shallow trench isolation (STI). Trench isolation 110 may be formed using any now known or later developed techniques. For example, a trench can be etched into substrate 104 and filled with an insulating material such as oxide, to isolate one region of substrate 104 from an adjacent region of the substrate. As understood, one or more transistors formed from active region(s) 106, 108 of a given polarity may be disposed within an area isolated by trench isolation 110. Each trench isolation 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

In this embodiment, single active region 106 can be distinguished from set of active regions 102 in how it is positioned at a distance from set of active regions 102. In this regard, forming set of active regions 102 and single active region 106 may include forming set of active regions 102 having a first spacing D1 therebetween. That is, set of active regions 102 have a pitch of D1 plus width of a fin. In contrast, single active region 106 is formed having a second spacing D2 from an outermost, adjacent active region 112 of set of active regions 102 that is at least twice that of first spacing D1. That is, the single semiconductor fin (106) is second spacing D2 from an outermost, adjacent fin 112. In this manner, single active region 106 is set off on its own from set of active regions 102. It will be appreciated that term "single" active region is to connote its relation to set of active regions 102 with which it shares some doping processing, as described herein. Single active regions 106 on substrate 104 with respective sets active regions (not shown) may be adjacent one another in an IC structure 100 (FIG. 6), without departing from the teachings of the disclosure.

In another non-limiting example, shown in FIG. 9 only, diffusion breaks 111 may be employed within a selected active region, e.g., a selected semiconductor fin 113, to create set of active regions 102 and single active region 106. Diffusion break(s) 111 may take a variety of forms, including single diffusion break (SDB) (shown) or double diffusion break (DDB) structures. In this manner, set of active regions 102 and single active region 106 may be created by forming a pair of diffusion breaks 111 in a selected semiconductor fin 113 such that set of active regions 102 and single active region 106 are portions of selected semiconductor fin 113 separated by pair of diffusion breaks 111 in the selected semiconductor fin. Diffusion breaks 111 may be formed using any now known or later developed techniques. For example, trenches can be etched into selected semiconductor fin 113 and filled with an insulating material such as oxide, to isolate set of active regions 102 (i.e., semiconductor fin 108 portions) from single active region 106 therebetween in selected semiconductor fin (i.e. single semiconductor fin 106). As understood, one or more transistors formed from active region(s) 106, 108 of a given polarity may be created by gates over respective active regions (either of 102, or 106) isolated by diffusion breaks 111. While only one semiconductor fin has been illustrated as being processed in this manner, any number of semiconductor fins can be processed in this manner to create a plurality of single active regions 106 on substrate 104 with respective sets active regions (not shown), without departing from the teachings of the disclosure.

Embodiments of the method may be applied in the same manner to the various arrangements of single active region 106 (FIG. 1 or 9), but will be generally described relative of trench isolation 110 (FIG. 1) with notable exceptions for the use of diffusion breaks 111 (FIG. 9) noted, where necessary.

FIG. 2 shows a cross-sectional view of first doping of set of active regions 102 and single active region 106. The first doping creates a first doping profile 120 in set of active regions 102 and single active region 106. Here, as shown in the plan view of FIG. 3, other active regions 122 on substrate 104, e.g., for other type of finFETs, may be covered by a mask 124—illustrated by different shades over the various semiconductor fins. Mask 124 may include any now known or later developed masking material, e.g., a silicon nitride hard mask. Mask 124 has an opening(s) 126 that exposes set of active regions 102 and single active region 106, but covers other areas in which first doping is not desired, e.g., other active regions 122. As understood in the art, the doping creates well implants (same location as first doping profile 120 in FIG. 2) in active regions 106, 108 and substrate 104. Where a single semiconductor fin is used with diffusion breaks 111 (FIG. 9), the parts of selected semiconductor fin 113 to be used to form set of active regions 102 and single active region 106 are both exposed by mask 124.

First doping may be carried out using any now known or later developed doping process such as but not limited to ion implanting. Usually in doping, a dopant, a dosage and an energy level are specified and/or a resulting doping level may be specified. A dosage may be specified in the number of atoms per square centimeter ($atom/cm^2$) and an energy level (specified in keV, kilo-electron-volts), resulting in a dopant concentration of a number of atoms per cubic centimeter ($atoms/cm^3$). The number of atoms is commonly specified in exponential notation, where a number like "3E15" means 3 times 10 to the 15th power, or a "3" followed by 15 zeroes (3,000,000,000,000,000). The dosage and energy level may vary depending on a large number of well understood parameters such as but not limited to: desired dopant concentration, desired depth of first dopant profile 120, technology node, active region dimensions, etc.

In one embodiment, for a p-finFET, the first doping includes using an n-type dopant to create n-well implants, i.e., in the location of first n-type doping profile 120 in FIG. 2. N-type dopants may include but are not limited to: phosphorous (P), arsenic (As), and antimony (Sb). An n-type dopant is an element introduced to semiconductor to generate free electrons (by "donating" electron to semiconductor); and must have one more valance electron than semiconductor. Other dopants may be used for other types of devices. Any mask 124 used for first doping may be removed, e.g., using an ashing process.

FIG. 4 shows a plan view of masking single active region 106, leaving set of active regions 102 exposed, among possibly other structures (not shown). Here, a mask 130 covers single active region 106—illustrated by different shades over the various semiconductor fins. Other active regions 122 on substrate 104, e.g., for other type of finFETs, may also be covered by mask 130. Mask 130 may include any now known or later developed masking material, e.g., a silicon nitride hard mask. Mask 130 has an opening(s) 132 that exposes set of active regions 102, but covers other areas in which first doping is not desired, e.g., single active region 106 and other active regions 122.

FIG. 5 shows a cross-sectional view of a second doping of set of active regions 102, creating a second doping profile 140 in set of active regions 102 that is different than first doping profile 120 of single active region 106. The dopant may be the same type as used for the first doping, e.g., an n-type dopant, creating a second n-type doping profile 140. As shown, mask 130 prevents single active region 106 from being doped during this process. As understood in the art, the second doping modifies the well implants created by the first doping, forming different well implants (same location as second doping profile 140) in set of active regions 102, i.e., active regions 108. Second doping may be carried out using any now known or later developed doping process such as but not limited to ion implanting. The dosage and energy level may vary depending on a large number of well understood parameters such as but not limited to: desired dopant concentration, desired depth of second dopant profile 140, technology node, active region dimensions, etc.

Figure 6:
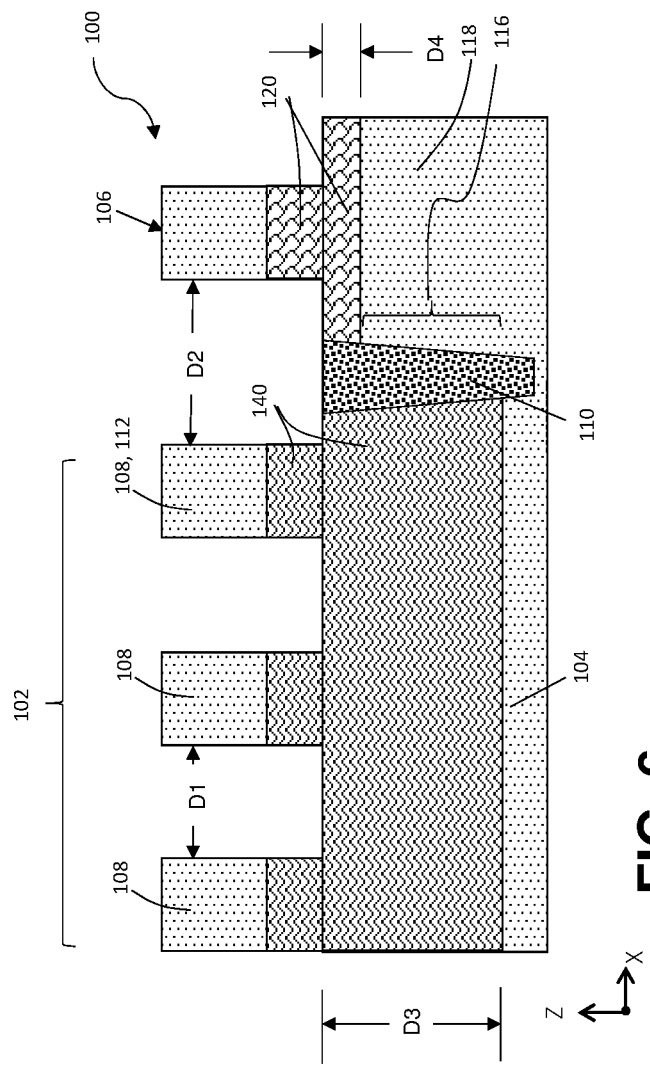
FIG. 6 shows a cross-sectional view of an IC structure, according to embodiments of the disclosure.
Figure 7:
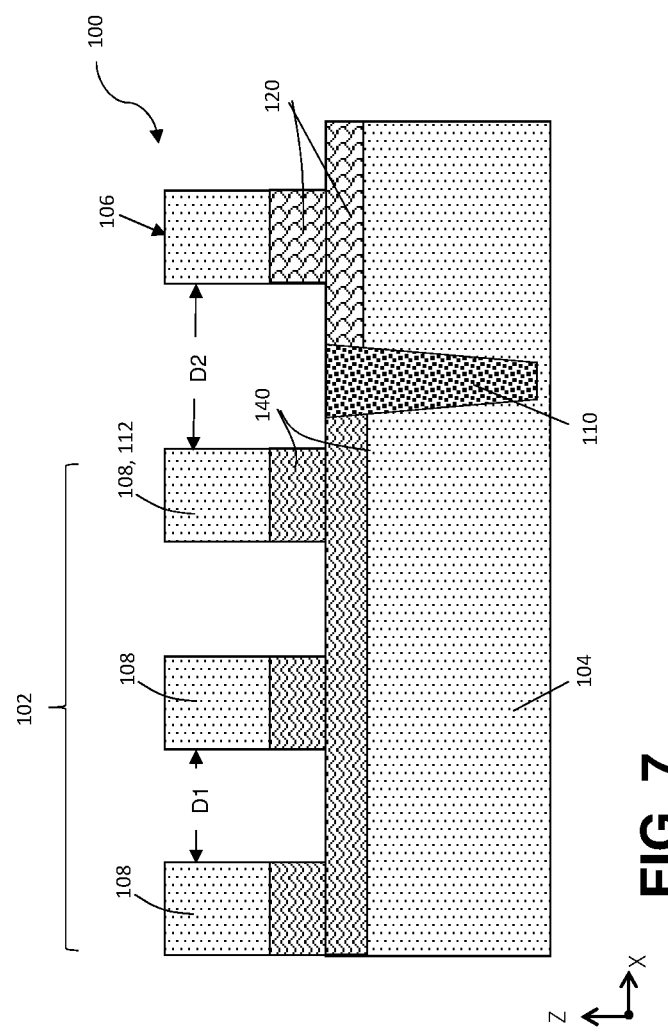
FIG. 7 shows a cross-sectional view of an IC structure, according to other embodiments of the disclosure.

In one embodiment, as shown in FIGS. 5 and 6, second doping profile 140 of set of active regions 102 may have a greater depth in substrate 104 than first doping profile 120 of single active region 106. In the example shown, second doping profile 140 of set of active regions 102 has depth D3 into substrate 104, and first doping profile 120 of single active region 106 has depth D4 into substrate 104, where D3>D4. In addition, a region 116 of second doping profile 140 that extends deeper than first doping profile 120 of single active region 106 into substrate 104 may have a higher dopant concentration than a region 118 of substrate 104 below first doping profile 120 of single active region 106, the latter of which may be devoid of dopants. In one non-limiting example, first dopant profile 120 and second dopant profile 140 may have a dopant concentration of between 5E17 and 5E18 atoms/cm$^3$ above a lowermost extent of first dopant profile 120. Second dopant profile 140 may have a different dopant concentration of between 3E17 and 5E18 atoms/cm$^3$ in a region thereof that extends beyond a lowermost extent of first doping profile (region 116). It is noted that the stated dopant concentrations may vary drastically depending on technology node and/or device. FIG. 7 shows an embodiment in which the dopant concentrations may be different, but the depth of the doping profiles 120, 140 is the same or substantially similar. Once the second doping is complete, as shown in FIGS. 6 and 7, mask 130 may be removed, e.g., using an ashing process.

It is noted that at least one of first doping (FIG. 2) and second doping (FIG. 4) steps may include a plurality of doping sub-steps. That is, one or both of the doping processes may include greater than one doping sub-step, e.g., a number of ion implantings of different dosage and energy levels. Any number of doping sub-steps may be included in each doping step.

In certain embodiments, the above-described method can be implemented automatically. For example, where a semiconductor fabrication data processing system identifies certain structural parameters, e.g., using Boolean logic, it may automatically reduce the doping processes applied to single active region 106 using mask 130, as described herein. The structural parameter that triggers the doping/mask change may vary. In one non-limiting example, the system may change the doping processes by creating additional mask 130 where single active region 106 is present in the layout and has a length greater than a threshold, e.g., 500 nanometers.

FIGS. 6 and 7 show cross-sectional views of IC structure 100 according to embodiments of the disclosure, i.e., after mask 130 (FIG. 5) removal. As illustrated, IC structure 100 may include single active region 106 on substrate 104 where single active region 106 has first doping profile 120. IC structure 100 may also include set of active regions 102 electrically isolated from single active region 106 on substrate 104, e.g., by trench isolation 110 between set of active regions 102 and single active region 106. Set of active regions 102, i.e., each active region 108, has a second doping profile 140 that is different than first doping profile 120 of single active region 106. Set of active regions 102 may have a first spacing D1 therebetween, and single active region 106 may have a second spacing D2 from an outermost, adjacent active region 112 of set of active regions 102 that is at least twice that of first spacing D1. While applicable to a variety of active regions for an IC, as illustrated herein, first set of active regions 102 may include a plurality of semiconductor fins 108, and single active region 106 may include a single semiconductor fin.

In terms of differences between the doping profiles 120, 140, as has been described, a region 116 of second doping profile 140 that extends deeper than first doping profile 120 of single active region 106 may have a higher dopant concentration than a region 118 of substrate 104 below first doping profile 120 of single active region 106, the latter of which may be devoid of dopants. Where the difference between doping profiles 120, 140 is just dopant concentrations, it is recognized that IC structure 100 may have doping profiles 120, 140 of the same or substantially similar depth in substrate 104, as shown in FIG. 7. In certain embodiments as shown in FIG. 6, second doping profile 140 of set of active regions 102 may be deeper than first doping profile 120 of single active region 106, i.e., into substrate 104. In the example shown in FIG. 6, second doping profile 140 of set of active regions 102 has depth D3 into substrate 104, and first doping profile 120 of single active region 106 has depth D4 into substrate 104, where D3>D4. The dopant may be any type dopant, but an n-type dopant for creating n-wells for a p-finFET finds special advantage, as described herein, to prevent defects in single active region 106.

FIG. 8 shows a plan view of a selected semiconductor fin 113 in which diffusion breaks 111 create single active region 106 and set of active regions 102. At this stage, the first doping has already been applied to selected semiconductor 113, creating first doping profile 120 (FIG. 9). As shown in FIG. 8, mask 130 is over single active region 106 for the second doping process, leaving set of active regions 102 exposed, among possibly other structure, e.g., other active regions/fins. Here, mask 130 covers single active region 106 between diffusion breaks 111—mask illustrated by different shades over the various semiconductor fins. As noted, other active regions 122 on substrate 104, e.g., for other type of finFETs, may also be covered by mask 130. Mask 130 may include any now known or later developed masking material, previously noted herein. Mask 130 has an opening(s) 132 that exposes set of active regions 102, but covers other areas in which first doping is not desired, e.g., single active region 106 and other active regions 122.

FIG. 9 shows a cross-sectional view of second doping of set of active regions 102, creating a second doping profile 140 in set of active regions 102 that is different than first doping profile 120 of single active region 106. The dopant may be the same type as used for the first doping, e.g., an n-type dopant, creating second n-type doping profile 140. As shown, mask 130 prevents single active region 106 from being doped during this process. As noted, the second doping modifies the well implants created by the first doping (profile shown as 12), forming different well implants (same location as second doping profile 140) in set of active regions 102, i.e., active regions 108. Here, second doping may be carried out using any now known or later developed doping process such as but not limited to ion implanting. The dosage and energy level may vary depending on a large number of well understood parameters such as but not limited to: length of single active region 106, desired dopant concentration, desired depth of second dopant profile 140, technology node, active region dimensions, etc. As illustrated, the FIGS. 8-9 processing can be applied to any number of selected semiconductor fins, e.g., 113 and an adjacent fin. Mask 130 may be removed after the second doping, e.g., using an ashing process.

Figure 10:
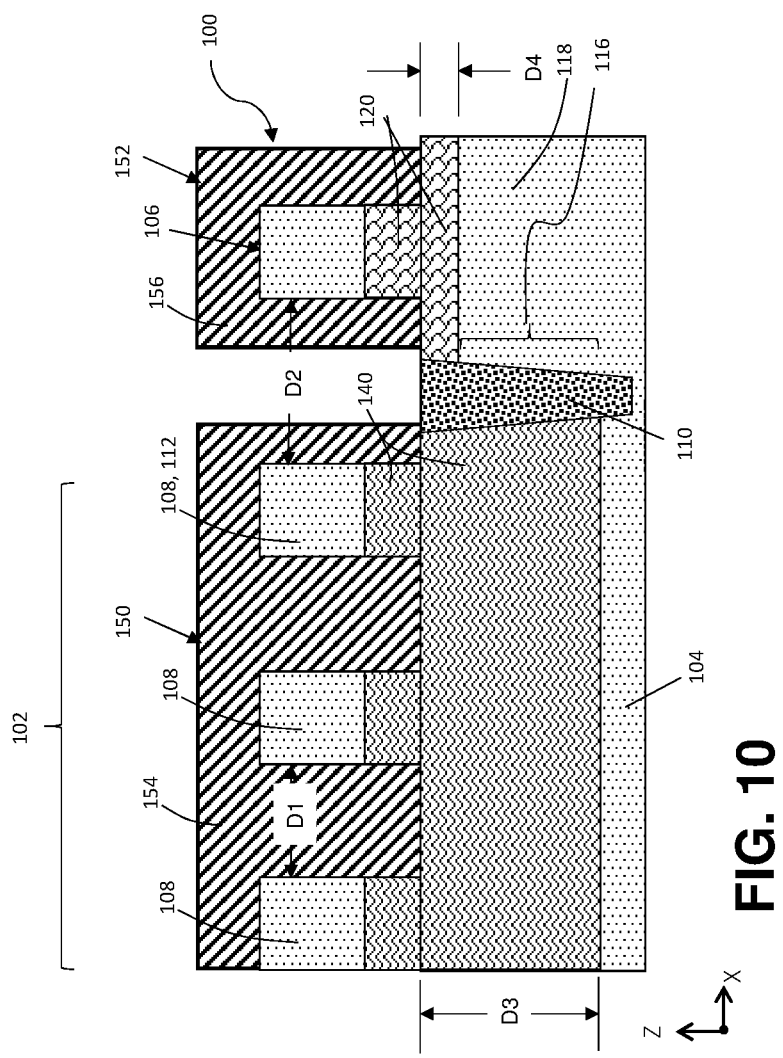
FIG. 10 shows a cross-sectional view of an IC structure after subsequent processing to form finFETs, according to embodiments of the disclosure.

FIG. 10 shows some illustrative subsequent conventional processing to form one or more transistor devices 150, 152, e.g., p-finFETs, as applied to the FIG. 6 embodiment. For example, FIG. 10 shows forming respective gate structures 154, 156 over set of active regions 102 and single active region 106, respectively. Gate structures 154, 156 may include any now known or later developed gate materials, e.g., for a metal gate. While FIG. 10 shows only the FIG. 6 embodiment, it is understood the processing can be applied to the FIG. 7 or the FIG. 9 embodiments. While a particular gate arrangement has been illustrated, it is understood that a wide variety of alternative gate structures and arrangements can be employed, e.g., a common gate across all active regions. It is also well understood in the art that other back-end-of-line processing may also be carried, e.g., formation of metal and via layers including contacts to the various gates and source/drain regions of the transistor devices.

Embodiments of the disclosure allow for a single semiconductor finFET 152 (FIG. 10) for low power devices at advanced technology nodes, e.g., 12 nanometers and beyond. The teachings may be applicable to any finFET, but are especially advantageous for p-finFET devices, i.e., with n-well implants that could damage the single semiconductor fin. Here, the extent (e.g., dopant concentration, etc.) and/or number of n-well implants of the single semiconductor fin and substrate are reduced compared to other sets of semiconductor fins, thus reducing or eliminating the cause of weakening defects in the single semiconductor fin. The resulting p-finFET does not suffer from defects that can result in stress-related, structural failures in the single semiconductor fin, nor the related performance degradation, such as increased current leakage.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a single active region on a substrate, the single active region having a first doping profile; and
   a set of active regions electrically isolated from the single active region on the substrate,
   wherein the set of active regions have a second doping profile that is different than the first doping profile of the single active region,
   wherein the second doping profile of the set of active regions is deeper in the substrate and has a higher dopant concentration than the first doping profile of the single active region, and
   wherein the first doping profile and the second doping profile have coplanar upper surfaces.

2. The IC structure of claim 1, wherein a region of the second doping profile that extends deeper than the first doping profile into the substrate has a higher dopant concentration than a region of the substrate below the first doping profile of the single active.

3. The IC structure of claim 1, wherein the set of active regions includes a plurality of semiconductor fins.

4. The IC structure of claim 1, wherein the single active region includes a single semiconductor fin.

5. The IC structure of claim 1, wherein a dopant of the first and second doping profiles is an n-type dopant.

6. The IC structure of claim 1, wherein the set of active regions have a first spacing therebetween, and the single active region has a second spacing from an outermost, adjacent active region of the set of active regions that is at least twice that of the first spacing.

7. The IC structure of claim 1, further comprising a trench isolation between the set of active regions and the single active region.

8. The IC structure of claim 1, wherein the set of active regions and the single active region are portions of a selected semiconductor fin separated by a pair of diffusion breaks in the selected semiconductor fin.

9. An integrated circuit (IC) structure, comprising:
- a single semiconductor fin on a substrate, the single semiconductor fin having a first n-type doping profile; and
- a set of semiconductor fins electrically isolated from the single semiconductor fin on the substrate, the set of semiconductor fins having a second n-type doping profile,
- wherein the second n-type doping profile of the set of semiconductor fins has a greater depth in the substrate than the first n-type doping profile of the single semiconductor fin,
- wherein the second n-type doping profile of the set of semiconductor fins is deeper in the substrate and has a higher dopant concentration than the first n-type doping profile of the single semiconductor fin, and
- wherein the first n-type doping profile and the second n-type doping profile have coplanar upper surfaces.

10. The IC structure of claim 9, wherein a region of the second n-type doping profile that extends deeper than the first n-type doping profile into the substrate has a higher dopant concentration than a region of the substrate below the first n-type doping profile of the single semiconductor fin.

11. The IC structure of claim 9, wherein the set of semiconductor fins have a first spacing therebetween, and the single semiconductor fin has a second spacing from an outermost, adjacent semiconductor fin of the set of semiconductor fins that is at least twice that of the first spacing.

12. The IC structure of claim 9, further comprising a trench isolation between the set of semiconductor fins and the single semiconductor fin.

13. A method of forming an integrated circuit (IC) structure, the method comprising:
- forming a set of active regions on a substrate, and a single active region electrically isolated from the set of active regions on the substrate;
- first doping the set of active regions and the single active region, creating a first doping profile in the set of active regions and the single active region;
- masking the single active region, leaving the set of active regions exposed; and
- second doping the set of active regions, creating a second doping profile in the set of active regions that is different than the first doping profile of the single active region,
- wherein the second doping profile of the set of active regions is deeper in the substrate and has a higher dopant concentration than the first doping profile of the single active region, and
- wherein the first doping profile and the second doping profile have coplanar upper surfaces.

14. The method of claim 13, wherein a region of the second doping profile that extends deeper than the first doping profile into the substrate has a higher dopant concentration than a region of the substrate below the first doping profile of the single active region.

15. The method of claim 13, wherein the set of active regions includes a plurality of semiconductor fins, and the single active region includes a single semiconductor fin.

16. The method of claim 13, wherein forming the set of active regions and the single active region includes forming the set of active regions have a first spacing therebetween, and the single active region having a second spacing from an outermost, adjacent active region of the set of active regions that is at least twice that of the first spacing.

17. The method of claim 13, wherein forming the set of active regions and the single active region includes forming a pair of diffusion breaks in a selected semiconductor fin, the set of active regions and the single active region being portions of the selected semiconductor fin separated by the pair of diffusion breaks in the selected semiconductor fin.

* * * * *